US010319693B2

(12) United States Patent
Lambert

(10) Patent No.: US 10,319,693 B2
(45) Date of Patent: Jun. 11, 2019

(54) MICRO-PILLAR ASSISTED SEMICONDUCTOR BONDING

(71) Applicant: Skorpios Technologies, Inc., Albuquerque, NM (US)

(72) Inventor: Damien Lambert, Los Altos, CA (US)

(73) Assignee: Skorpios Technologies, Inc., Albuquerque, NM (US)

( * ) Notice: Subject to any disclaimer, the term of this patent is extended or adjusted under 35 U.S.C. 154(b) by 400 days.

(21) Appl. No.: 14/741,181

(22) Filed: Jun. 16, 2015

(65) Prior Publication Data

US 2015/0364441 A1 Dec. 17, 2015

Related U.S. Application Data

(60) Provisional application No. 62/012,814, filed on Jun. 16, 2014.

(51) Int. Cl.
*H01L 23/00* (2006.01)
*G02B 6/42* (2006.01)
(Continued)

(52) U.S. Cl.
CPC ............ *H01L 24/05* (2013.01); *G02B 6/3636* (2013.01); *G02B 6/423* (2013.01); *G02B 6/4232* (2013.01); *G02B 6/4245* (2013.01); *H01L 21/187* (2013.01); *H01L 21/2007* (2013.01); *H01L 23/3178* (2013.01); *H01L 24/13* (2013.01);
(Continued)

(58) Field of Classification Search
CPC ....... H01L 21/302; H01L 24/04; H01L 24/05; H01L 24/06; H01L 24/07; H01L 24/08; H01L 24/09; H01L 21/187; H01L 21/185; H01L 21/2007; H01L 23/3178; H01L 2924/18301; H01L 2933/0083; G02B 2006/12107; G02B 6/4232; G02B 6/423; G02B 6/4245
See application file for complete search history.

(56) References Cited

U.S. PATENT DOCUMENTS 5,077,878 A * 1/1992 Armiento ............... G02B 6/423
148/DIG. 95
5,898,806 A * 4/1999 Nishimoto ............... G02B 6/42
385/14
(Continued)

OTHER PUBLICATIONS

U.S. Appl. No. 62/012,814, filed Jun. 16, 2014, Damien Lambert, all pages.
(Continued)

*Primary Examiner* — Mark W Tornow
*Assistant Examiner* — Abbigale A Boyle
(74) *Attorney, Agent, or Firm* — Kilpatrick Townsend & Stockton LLP

(57) ABSTRACT

Micro pillars are formed in silicon. The micro pillars are used in boding the silicon to hetero-material such as III-V material, ceramics, or metals. In bonding the silicon to the hetero-material, indium is used as a bonding material and attached to the hetero-material. The bonding material is heated and the silicon and the hetero-material are pressed together. As the silicon and the hetero-material are pressed together, the micro pillars puncture the bonding material. In some embodiments, pedestals are used in the silicon as hard stops to align the hetero-material with the silicon.

20 Claims, 9 Drawing Sheets

(51) Int. Cl.
*G02B 6/36* (2006.01)
*H01L 21/20* (2006.01)
*H01L 23/31* (2006.01)
*H01L 21/18* (2006.01)
*H01L 25/065* (2006.01)
*H01L 25/00* (2006.01)

(52) U.S. Cl.
CPC .............. *H01L 24/29* (2013.01); *H01L 24/30* (2013.01); *H01L 24/73* (2013.01); *H01L 24/81* (2013.01); *H01L 24/83* (2013.01); *H01L 24/92* (2013.01); *H01L 25/0657* (2013.01); *H01L 25/50* (2013.01); *H01L 24/03* (2013.01); *H01L 24/11* (2013.01); *H01L 2224/0361* (2013.01); *H01L 2224/04026* (2013.01); *H01L 2224/05557* (2013.01); *H01L 2224/05638* (2013.01); *H01L 2224/1161* (2013.01); *H01L 2224/136* (2013.01); *H01L 2224/13013* (2013.01); *H01L 2224/13017* (2013.01); *H01L 2224/13018* (2013.01); *H01L 2224/13019* (2013.01); *H01L 2224/13138* (2013.01); *H01L 2224/14131* (2013.01); *H01L 2224/29017* (2013.01); *H01L 2224/29082* (2013.01); *H01L 2224/29109* (2013.01); *H01L 2224/3003* (2013.01); *H01L 2224/3012* (2013.01); *H01L 2224/32145* (2013.01); *H01L 2224/32147* (2013.01); *H01L 2224/73204* (2013.01); *H01L 2224/81191* (2013.01); *H01L 2224/81903* (2013.01); *H01L 2224/8301* (2013.01); *H01L 2224/83012* (2013.01); *H01L 2224/8314* (2013.01); *H01L 2224/83048* (2013.01); *H01L 2224/83139* (2013.01); *H01L 2224/83191* (2013.01); *H01L 2224/83385* (2013.01); *H01L 2224/83815* (2013.01); *H01L 2224/83902* (2013.01); *H01L 2224/9211* (2013.01); *H01L 2225/06513* (2013.01); *H01L 2225/06555* (2013.01)

(56) References Cited

U.S. PATENT DOCUMENTS

| | | | |
|---|---|---|---|
| 6,713,844 B2* | 3/2004 | Tatsuta | H01L 21/563 |
| | | | 174/535 |
| 6,888,989 B1 | 5/2005 | Zhou et al. | |
| 7,326,611 B2 | 2/2008 | Forbes | |
| 7,531,395 B2 | 5/2009 | Blomiley et al. | |
| 7,939,934 B2 | 5/2011 | Haba et al. | |
| 8,753,924 B2* | 6/2014 | Wainerdi | H01L 24/29 |
| | | | 257/675 |
| 9,136,233 B2* | 9/2015 | Chapelon | H01L 24/03 |
| 2001/0010743 A1* | 8/2001 | Cayrefourcq | G02B 6/4232 |
| | | | 385/88 |
| 2004/0077135 A1 | 4/2004 | Fan et al. | |
| 2004/0182914 A1 | 9/2004 | Venugopalan | |
| 2004/0245425 A1 | 12/2004 | Delpiano et al. | |
| 2005/0082552 A1 | 4/2005 | Fang et al. | |
| 2006/0002443 A1 | 1/2006 | Farber et al. | |
| 2006/0093002 A1 | 5/2006 | Park et al. | |
| 2006/0104322 A1 | 5/2006 | Park et al. | |
| 2010/0059897 A1* | 3/2010 | Fay | H01L 24/03 |
| | | | 257/777 |
| 2010/0111128 A1 | 5/2010 | Qin et al. | |
| 2010/0123145 A1 | 5/2010 | Lee | |
| 2011/0085760 A1 | 4/2011 | Han et al. | |
| 2011/0216997 A1 | 9/2011 | Gothoskar et al. | |
| 2011/0267676 A1* | 11/2011 | Dallesasse | H01S 5/021 |
| | | | 359/279 |
| 2012/0002931 A1 | 1/2012 | Watanabe | |
| 2013/0051727 A1 | 2/2013 | Mizrahi et al. | |
| 2013/0301975 A1 | 11/2013 | Spann et al. | |
| 2014/0319656 A1 | 10/2014 | Marchena et al. | |
| 2015/0097211 A1 | 4/2015 | Krasulick et al. | |

OTHER PUBLICATIONS

International Search Report and Written Opinion of PCT/US2014/035563 dated Aug. 27, 2014, 15 pages.
International Preliminary Report on Patentability of PCT/US2014/035563 dated Nov. 5, 2015, 15 pages.
International Search Report and Written Opinion dated Jan. 22, 2015 for International Patent Application No. PCT/US2014/059900 filed on Oct. 9, 2014, 13 pages.

* cited by examiner

MICRO-PILLAR ASSISTED SEMICONDUCTOR BONDING

CROSS-REFERENCES TO RELATED APPLICATIONS

This application claims priority to U.S. Provisional Application No. 62/012,814, filed on Jun. 16, 2014, the disclosure of which is incorporated by reference in its entirety for all purposes.

BACKGROUND

Silicon integrated circuits have dominated the development of electronics and many technologies based upon silicon processing have been developed over the years. Their continued refinement led to nano-scale feature sizes that can be important for making metal oxide semiconductor CMOS circuits. On the other hand, silicon is not a direct-bandgap material. Although direct-bandgap materials, including III-V compound semiconductor materials, have been developed, there is a need in the art for improved methods and systems related to photonic integrated circuits utilizing silicon substrates.

This application relates to bonding a first semiconductor to a second semiconductor. More specifically, and without limitation, to bonding a III-V semiconductor to a silicon semiconductor.

BRIEF SUMMARY OF THE INVENTION

Embodiments generally relate to bonding a first semiconductor to a second semiconductor, wherein the first semiconductor, and/or the second semiconductor, have micro pillars to assist in bonding. An example of bonding a first semiconductor to a second semiconductor is disclosed in commonly owned U.S. patent application Ser. No. 14/262,529, filed on Apr. 25, 2014, which is incorporated by reference in its entirety for all purposes.

This application discloses devices and methods used for bonding a first semiconductor to a second semiconductor. Though not limiting, in some embodiments micro pillars on a silicon substrate are used to penetrate a bonding material (e.g., indium) when attaching a hetero-material (e.g., III-V; from the periodic table of the elements, group III elements include: B, Al, Ga, In, Tl, and group V elements include: N, P, As, Sb, and Bi) device to a silicon semiconductor structure. Bonding a planar silicon surface to a planar III-V material using indium has some challenges. For example, in some embodiments, a bond between silicon and the hetero-material device is used as an electrical contact (e.g., ohmic contact). Yet indium oxide can form on indium before or during bonding, thus reducing functionality of the electrical contact. In some embodiments, pillars help break indium oxide and penetrate into the indium during bonding. Second, in some embodiments, heat is applied to the III-V material to heat the indium to a desired temperature (e.g., near, at, or above a melting point of the bonding material). If the silicon is planar, the silicon acts as a heat sink, making heating of the indium more difficult. In some embodiments, pillars are used to reduce an initial surface-contact area between the silicon and the indium so that not as much heat is transferred to the silicon during bonding (e.g., making it easier to melt the indium). Though silicon, indium, and III-V material are used as examples of bonding, similar processes and device structures can be applied to other bonding techniques.

Further areas of applicability of the present disclosure will become apparent from the detailed description provided hereinafter. It should be understood that the detailed description and specific examples, while indicating various embodiments, are intended for purposes of illustration only and are not intended to necessarily limit the scope of the disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

The ensuing description provides preferred exemplary embodiment(s), and is not intended to limit the scope, applicability, or configuration of the disclosure. Rather, the ensuing description of the preferred exemplary embodiment(s) will provide those skilled in the art with an enabling description for implementing a preferred exemplary embodiment. It is understood that various changes may be made in the function and arrangement of elements without departing from the spirit and scope as set forth in the appended claims.

Figure 1:
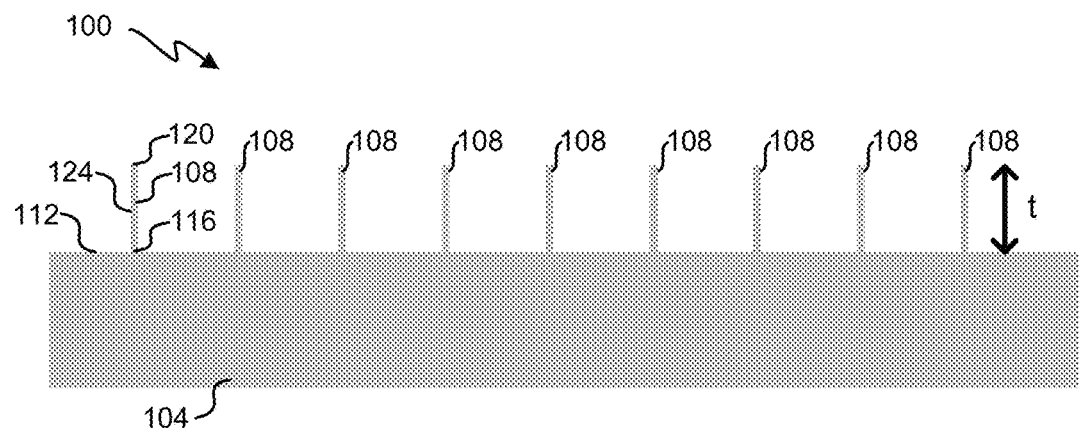
FIG. 1 depicts a side view of an embodiment of a first semiconductor comprising a substrate and pillars.

Referring to FIG. 1, a side view of an embodiment of a first semiconductor 100 comprising a substrate 104 and a plurality of pillars 108 is shown. The pillars 108 extend from the substrate 104 in a direction normal to a top surface 112 of the substrate 104. In some embodiments, the substrate 104 and/or the pillars 108 are made of silicon (e.g., crystalline silicon). The pillars 108 can be formed using lithography (e.g., etched from a same wafer, such as a silicon-on-insulator (SOI) wafer, as the substrate 104). In this embodiment, the pillars 108 are rectangular and arranged in an array. But other shapes and patterns may be used. Each of the plurality of pillars 108 have a thickness, t. But in some embodiments, pillars 108 have varying thicknesses. The pillars 108, in some embodiments, are coated with one or more layers of a dielectric and/or metal (e.g., for under-bump metallization). In FIG. 1, only a portion of the substrate 104 is shown. In some embodiments, other components (e.g., waveguides, couplers, gratings, and/or thermal diodes) are layered above and/or in the substrate 104. In this embodiment, the top surface 112 of the substrate 104 forms a bottom of a recess, or pit, for insertion of a second semiconductor (e.g., a chip comprising a gain medium) comprising material that is not in the first semiconductor. For example, the substrate 104 is made of silicon and the second semiconductor is a chip made of ceramics, metals, or composite hetero-material such as III-V material (e.g., InP or GaAs).

Each pillar 108 comprises a proximal end 116, a distal end 120, and one or more sides 124 between the proximal end 116 and the distal end 120. The distal end 120 is opposite the proximal end 116. The proximal end 116 is closer to the substrate 104 than the distal end 120. The thickness t is measured from the proximal end 116 to the distal end 120.

Figure 2:
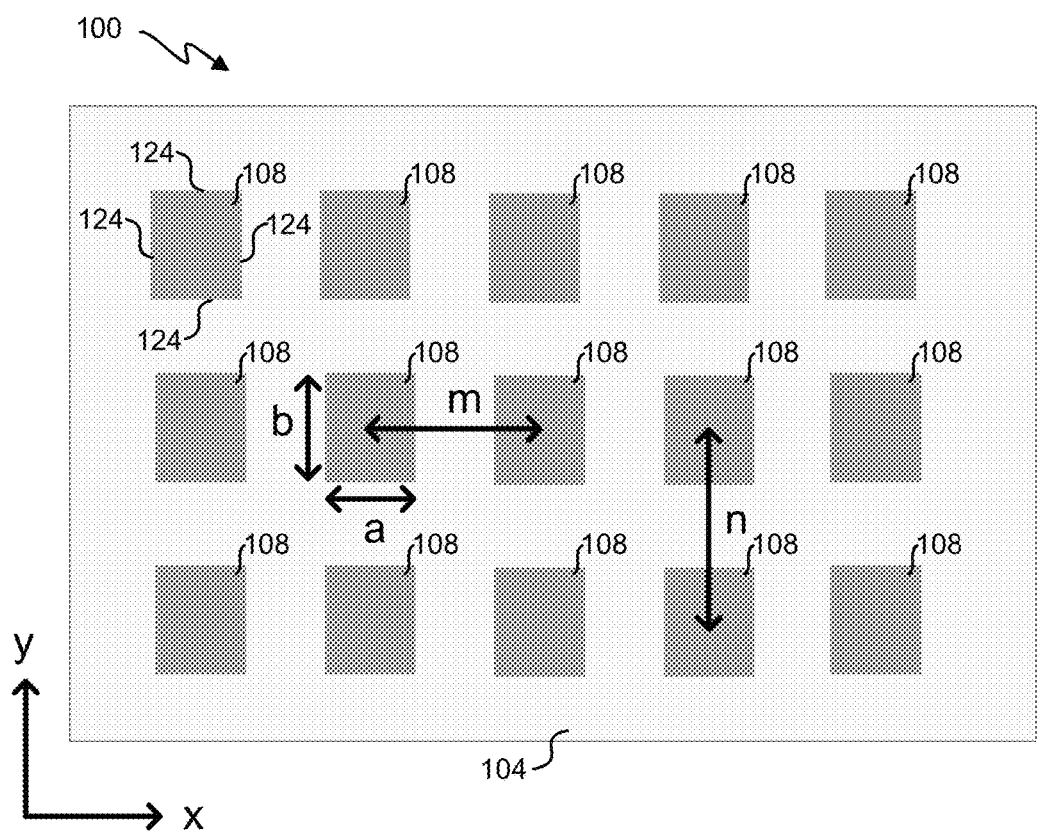
FIG. 2 depicts a top view of an embodiment of the first semiconductor.

Referring to FIG. 2, a top view of an embodiment of the first semiconductor 100 is shown. In this embodiment, the pillars 108 are formed in an array. In some embodiments, the pillars 108 are arranged in a different pattern and/or randomized. The pillars 108, in aggregate, have a fill ratio between 5% and 95% of at least a portion of the top surface 112 of the substrate 104. In some embodiments, having a fill ratio between 15% and 40% (e.g., 15, 20, 25, 30, 33, 35, or 40%) provides good penetration of bonding material by the pillars 108. The top view of the embodiment of the first semiconductor 100 shows cross sections of the pillars 108. The pillars 108 are rectangular, have a width, a (measured along an x axis), and a length, b (measured along a y axis). Centers of adjacent pillars 108 are separated by a first distance, m (measured along an x axis) and a second distance, n (measured along a y axis). In this embodiment, a=b and m=n. Thus with m=2*a, there is a fill ratio of 25%; m=sqrt(2)*a there is a 50% fill ratio; and m=(2/sqrt(3))*a, there is a fill ratio of 75%.

The pillars 108 have four sides 124 since the pillars 108 are rectangular. Other cross-sectional shapes can be used. For example, a pillar 108 that is tubular (e.g., circular cross section), may have only one side 124. Whereas a pillar 108 that is triangular has three sides 124.

The width a of pillars 108 and the length b of pillars 108 can vary (e.g., a=0.2, 0.5, 0.75, 1, 2, 3, 4, 5, 10, 20, or 30 μm). In some embodiments, width a and/or length b are less than thickness t (e.g., a<½t, ⅓t, or ¼t).

Figure 3A:
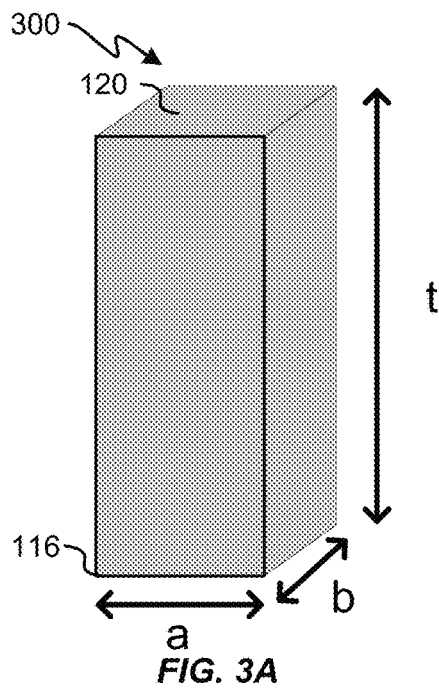
FIGS. 3A-3D depict examples of shapes of pillars.
Figure 3B:
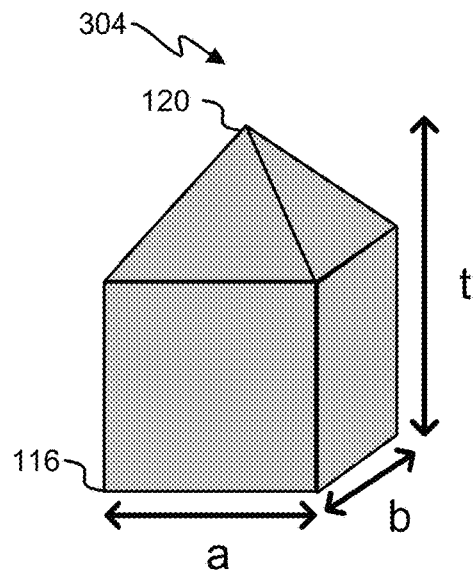

Referring to FIGS. 3A-3D, examples of different shapes of pillars 108 (sometimes referred to as micro pillars) are shown. In some embodiments, pillars 108 help break and/or penetrate through an oxide (e.g., indium oxide) of a bonding material. In FIG. 3A, a rectangular pillar 300 is shown. In some embodiments, a rectangular cross section is used for more uniform etching. The rectangular pillar 300 has a thickness t, a width a, and a length b. In FIG. 3B, a pointed pillar 304 is shown. the pointed pillar 304 has a rectangular cross section at the proximal end 116, and a point at the distal end 120. In some embodiments, the point at the distal end 120 is formed by wet etching along one or more crystal axes of the first semiconductor 100. Besides improving penetration of the oxide for bonding, the point at the distal end 120 can also reduce heat transfer from bonding material to the substrate 104 as the bonding material is heated during bonding.

Figure 3C:
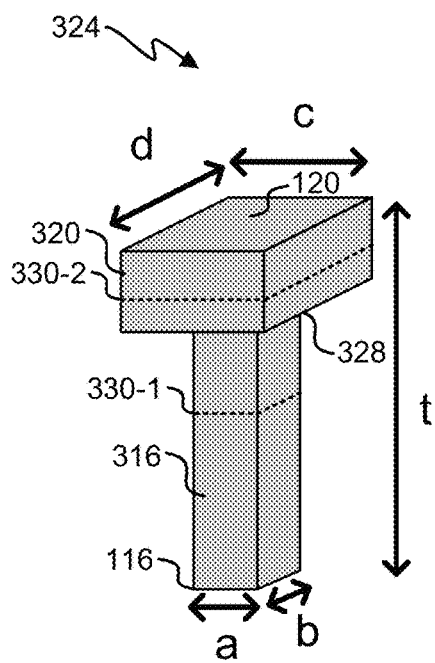
Figure 3D:
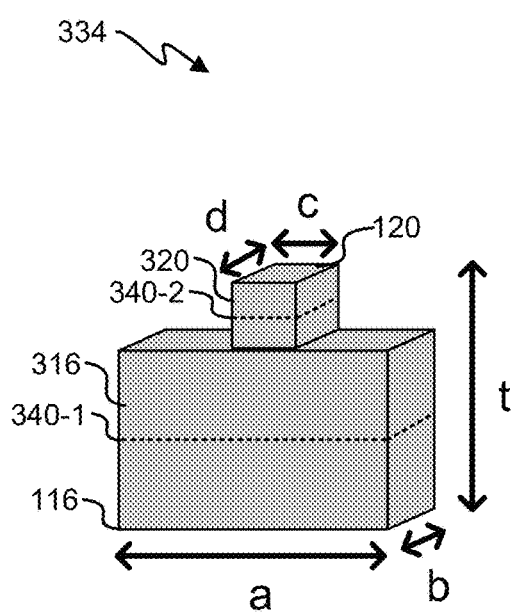

In FIGS. 3C and 3D, pillars 108 having a first portion 316 and a second 320 are shown. The first portion 316 comprises the proximal end 116. The second portion 320 comprises the distal end 120. The first portion 316 has the width a and the length b. The second portion 320 has a width c and a length d. Cross sections are planes of the pillar 108 that are parallel to the top surface 112 of the substrate 104.

In FIG. 3C, a t-shaped pillar 324 is shown. For the t-shaped pillar 324, the first portion 316 has a first cross section 330-1 that is smaller than a second cross section 330-2 of the second portion 320. Put another way, a<c, b<d, and/or (a×b)<(c×d). In some embodiments, a t-shaped pillar 324 is used to act as a hook to trap bonding material between the second portion 320 and the substrate 104 (e.g., for improving adhesion). In some embodiments, the second portion 320 tapers to the first portion 316. In some embodiments, the t-shaped pillar 324 is formed by a dry etch to make an undercut 328 between the second portion 320 and the first portion 316.

In FIG. 3D, a fin pillar 334 is shown. For the fin pillar 334, the first portion 316 has a first cross section 340-1 that is larger than a second cross section 340-2 of the second portion 320. Put another way, a>c, b>d, and/or (a×b)>(c×d). In some embodiments, the second portion 320 of the fin pillar 334 is used to more easily penetrate the bonding material (e.g., an oxide formed on the bonding material) because the second portion 320 of the fin pillar 334 has a smaller cross section than the first portion 316 of the fin pillar 334; and the first portion 316 of the fin pillar 334 provides more surface area for bonding. In some embodiments, the first portion 316 of the fin pillar 334 is contiguous with the first portion 316 of another (second) fin pillar 334 (e.g., a=m and b<n; and/or b is equal to or less than a/2). In some embodiments, having the first portion 316 of the fin pillar 334 contiguous with the first portion 316 of another fin pillar 334 is used to channel bonding material.

In some embodiments, shapes and density of pillars 108 are optimized to modulate heat transfer. Bonding material is placed on the second semiconductor. Heat is applied to the bonding material by applying heat to the second semiconductor. The second semiconductor is pressed against the first semiconductor 100 while applying heat to the second semiconductor. Heat is used to melt the bonding material. The first semiconductor 100 acts as a heat sink, drawing heat away from the bonding material. Heat transfer is modulated by adjusting the fill ratio of an aggregate of cross-sectional areas of pillars 108 to an exposed area of the substrate 104 (i.e., parts of the top surface 112 not covered by pillars 108. The smaller the fill ratio (up to a limit of mechanical breakdown of the pillars), the lower the heat transfer to the first semiconductor, and the easier it is to melt the bonding material (e.g., indium) while heat is applied to the second semiconductor. But a smaller fill ratio reduces contact area that the first semiconductor 100 has with the bonding material.

In some embodiments, shapes and density of pillars 108 are optimized for pressure transfer to break an outer layer (e.g., oxide) formed on the bonding material. Optimization for pressure transfer is done by also changing the fill ratio and shape of the pillars 108. The smaller the fill ratio (up to the limit of mechanical breakdown of the pillars), the higher the pressure is applied to the outer layer by the pillars 108, and the easier it becomes to break the outer layer of the bonding material. Additionally, the distal end 120 of pillars 108 can be made small (e.g., pointy and/or small cross section) to improve the ability of the pillars 108 to break the outer layer of the bonding material. Maximum widths (e.g., a, or c if the second portion 320 is used) and/or lengths (e.g., b or d if the second portion 320 is used) of pillars 108 for puncturing the bonding material can depend on one or more factors including alloy used as bonding material (e.g., density and/or viscosity), proximal end 120 shape (e.g., whether or not there is a point) bond temperature, bond pressure, and fill ratio. Thus, in some embodiments, a maximum pillar width and/or length for puncturing (e.g., a and/or b, or c and/or d if the second portion 320 is used) is equal to and/or less than 30, 25, 20, and/or 15 µm.

Elements of the rectangular pillar 300, the pointed pillar 304, the t-shaped pillar 324, and/or the fin pillar 334, can be combined with each other to form new pillar designs. For example, the second portion 320 of the t-shaped pillar 324 or the fin pillar 334 can be made with a point similar to the pointed pillar 304 to provide better penetration of the bonding material.

Figure 4:
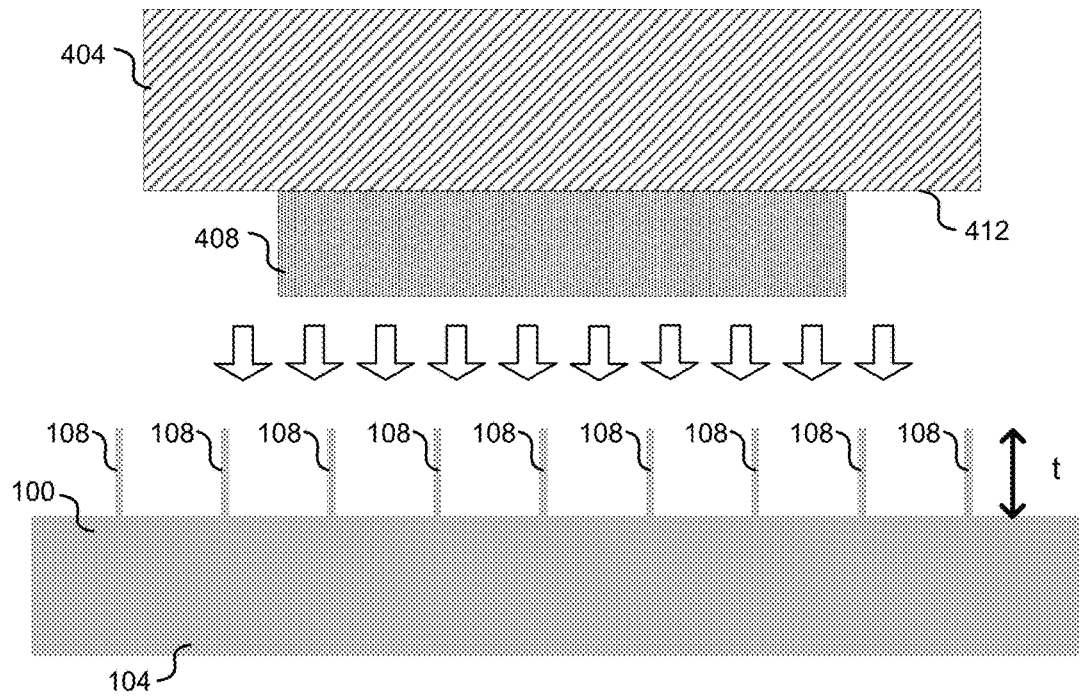
FIG. 4 depicts a side view of an embodiment before bonding the first semiconductor to a second semiconductor.

Referring next to FIG. 4, a side view of an embodiment of the first semiconductor 100 and a second semiconductor 404 before bonding is shown. In FIG. 4, the second semiconductor 404 (e.g., a chip made of III-V material) has a bonding material 408 (e.g., indium) attached to a bottom surface 412 of the second semiconductor 404. The first semiconductor 100 comprises the substrate 104 and the plurality of pillars 108. The second semiconductor 404 and the first semiconductor 100 are to be pressed together (e.g., by pushing the second semiconductor 404 toward the first semiconductor 100).

As the second semiconductor 404 is pressed toward the first semiconductor 100, local force on the bonding material 408 is increased due to reduced contact area of the pillars 108. Further, local heat transfer between the bonding material 408 and the first semiconductor 100 is reduced due to a reduced contact area of the pillars 108, thus making it easier to melt the bonding material 408. In some embodiments, both force and heat are applied to the second semiconductor 404. In some embodiments, an oxide forms an outer layer of the bonding material 408 (forming a crust on the bonding material 408). Pillars 108 help break the crust of the bonding material 408 to facilitate bonding and/or extend past the outer layer for increasing connectivity of the first semiconductor 100 to the second semiconductor 404.

Figure 5:
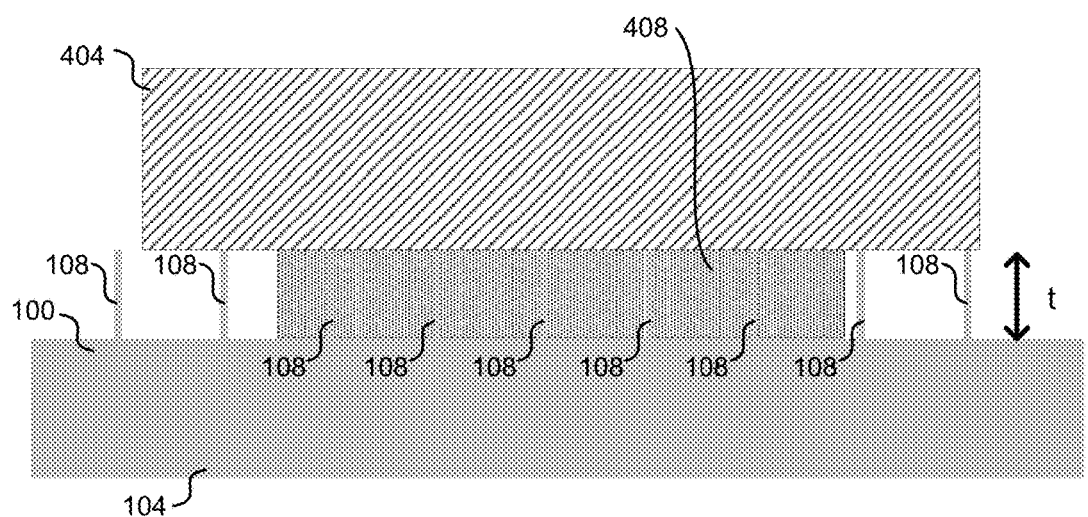
FIG. 5 depicts a side view of an embodiment after bonding the first semiconductor to the second semiconductor.

Referring to FIG. 5, a side view of an embodiment of the first semiconductor 100 and the second semiconductor 404 after bonding is shown. The pillars 108 penetrated the bonding material 408 such that the bonding material 408 surrounds each of the plurality of pillars 108 by contacting the one or more sides 124 of each pillar 108 of the plurality of pillars 108. The bonding material 408 fastens the first semiconductor 100 to the second semiconductor 404. In some embodiments, the pillars 108 are used as a stop for pressing the second semiconductor 404 to the first semiconductor (e.g., to align the second semiconductor 404 to the first semiconductor 100). In some embodiments, the pillars 108 don't stop the second semiconductor such that bonding material 408 contacts (e.g., covers) the distal end 120, as well as sides 124, of pillars 108. In some embodiments, one or more coatings are applied to pillars 108 before bonding; and the one or more coatings become part of the pillars 108. In some embodiments, a number of pillars 108 is equal to or greater than 10 to puncture the bonding material 408 and/or provide more surface area for bonding and/or contact.

Figure 6:
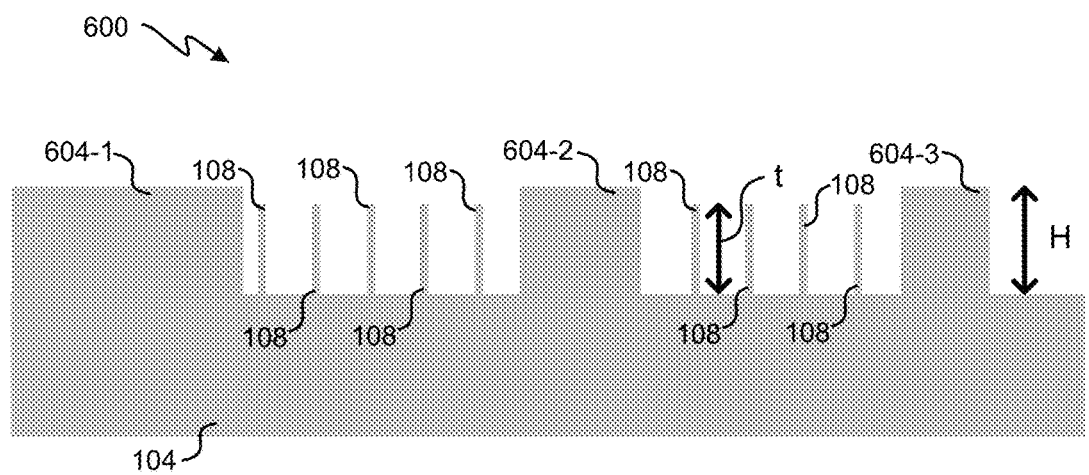
FIG. 6 depicts a side view of an embodiment of the first semiconductor comprising pillars and pedestals.

Referring to FIG. 6, a side view of an embodiment of a first semiconductor 600 comprising a substrate 104, pillars 108, and pedestals 604 is shown. The pedestals 604 extend from the top surface 112 of the substrate 104 to a height H (e.g., 0.1 µm≤H≤50 µm; H=0.1, 1, 4, 10, 20, 30, 40, or 50 µm). In some embodiments, the pedestals 604 are made by etching. In some embodiments, pedestals are made by etching and have a height H less than or equal to 1.3, 1.0, and/or 0.6 µm to reduce an amount of etching needed while providing alignment (e.g., height registration) between the first semiconductor 600 and the second semiconductor 404. In some embodiments, the pedestals 604 are made by growing material on the substrate 104. In some embodiments, pedestal 604 widths and lengths are set so that an aggregate area of the pedestals 604 can mechanically support and act as a stop positioning/blocking surface for the second semiconductor while pressure is applied to the second semiconductor 404. For example, in some embodiments a width of a pedestal is greater than or equal to 20, 25, and/or 30 µm to provide mechanical support. In some embodiments, the thickness t of pillars 108 is less than the height H of the pedestals 604. In some embodiments, the pedestals 604 are used similarly to pedestals in the '529 application. FIG. 6 shows the first semiconductor 600 having a first pedestal 604-1, a second pedestal 604-2, and a third pedestal 604-3. Pillars 108 are between the first pedestals 604-1 and the second pedestal 604-2. Pillars 108 are between the second pedestals 604-2 and the third pedestal 604-3. In some embodiments, pedestals 604 have a width that is greater than twice the width a and or length b of pillars 108 so that the pedestals 604 provide structural support for the second semiconductor 404 and the pillars 108 puncture the bonding material 408 and/or increase surface area for the bonding material 408 to bond the second semiconductor 404 to the first semiconductor 600.

Figure 7:
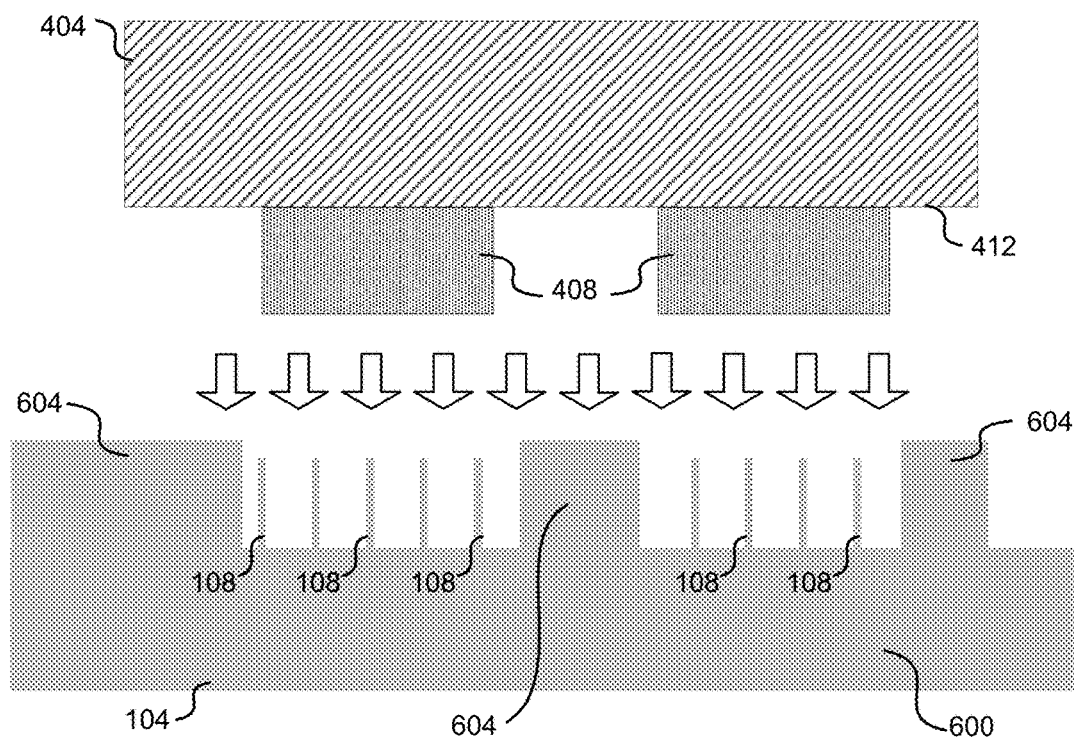
FIG. 7 depicts a side view of an embodiment of the first semiconductor comprising pillars and pedestals before bonding to a second semiconductor.

Referring to FIG. 7, a side view of an embodiment of the first semiconductor 600 and the second semiconductor 404 before bonding is shown. Bonding material 408 (e.g., indium) is attached to the bottom surface 412 of the second semiconductor 404. The bonding material 408 is positioned on the bottom surface 412 of the second semiconductor 404 to avoid bonding material 408 getting on top of pedestals 604.

The second semiconductor 404 and the first semiconductor 600 are to be pressed together (e.g., by pushing the second semiconductor 404 toward the first semiconductor 600). As the second semiconductor 404 is pressed toward the first semiconductor 600, local force on the bonding material 408 is increased due to reduced contact area of the pillars 108. Further, local heat transfer between the bonding material 408 and the first semiconductor 600 is reduced due to a reduced contact area of the pillars 108, thus making it easier to melt the bonding material 408. In some embodiments, both force and heat are applied to the second semiconductor 404 during bonding.

Figure 8A:
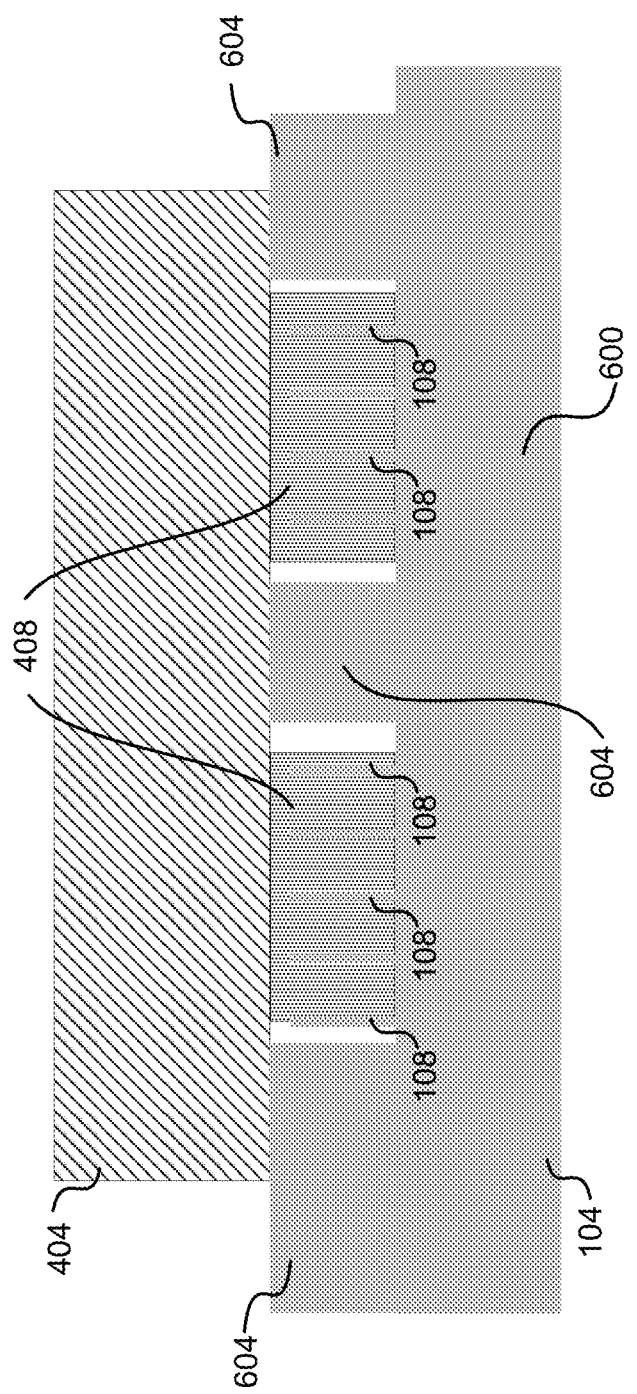
FIGS. 8A-8C depict side views of embodiments after bonding the first semiconductor, comprising pillars and pedestals, to the second semiconductor.
Figure 8B:
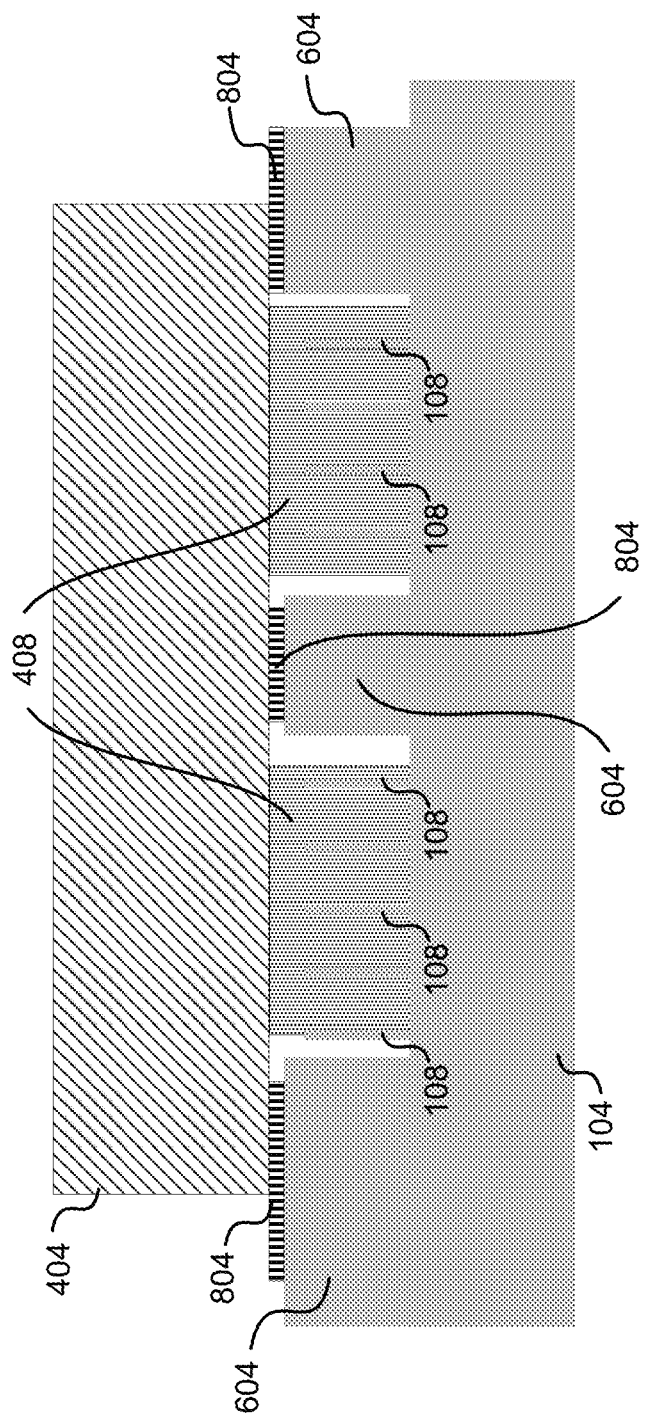
Figure 8C:
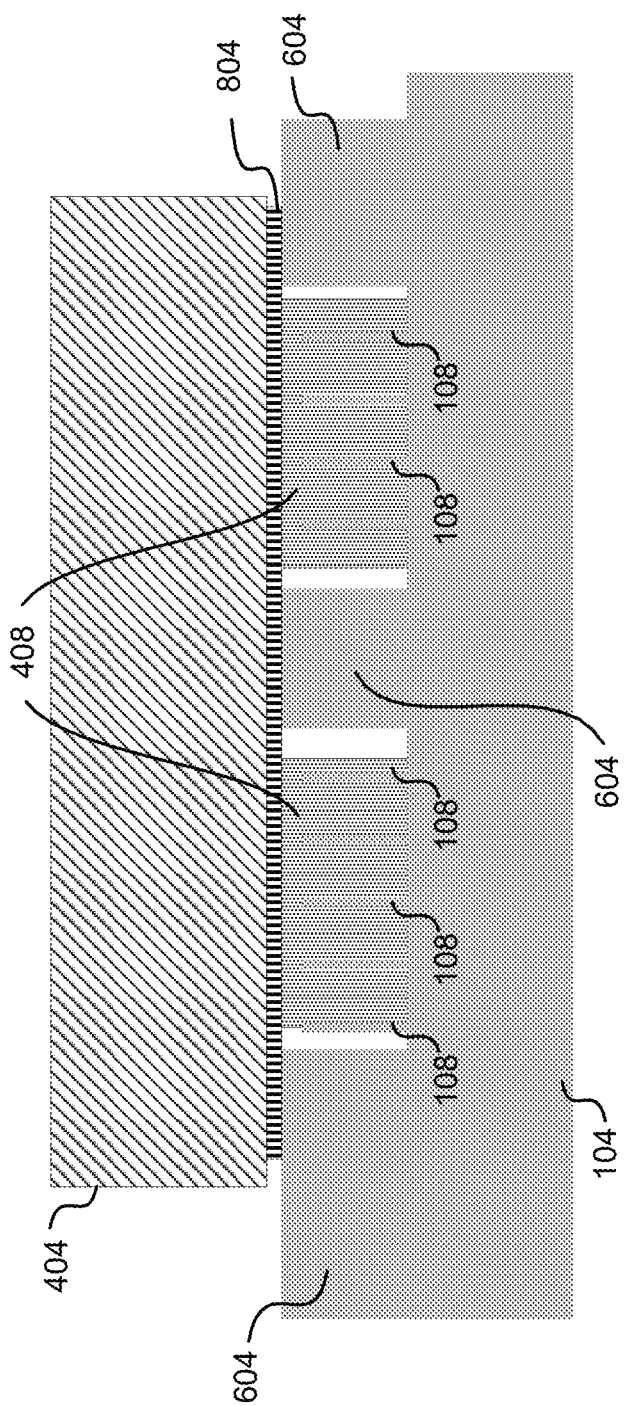

Referring to FIGS. 8A, 8B, and 8C, side views of embodiments of a first semiconductor 600, which has pillars 108 and pedestals 604, bonded to a second semiconductor 404 (e.g., a chip made of III-V material) are shown. Precise height-positioning of the second semiconductor 404 is achieved by resting the second semiconductor 404 on pedestals 604 (the pedestals 604 being used as a hard stop). The pillars 108 penetrate the bonding material 408 such that the bonding material 408 surrounds each of the plurality of pillars 108, contacting the one or more sides 124 of each pillar 108 of the plurality of pillars 108. The bonding material 408 fastens the first semiconductor 600 to the second semiconductor 404. Bonding material 408 is pushed to edges of the second semiconductor 404. Local heat transfer increases after the second semiconductor 404 and the first semiconductor 600 are pressed together and the bonding material 408 fills between the substrate 104 and the second semiconductor 404, which helps in cooling the bonding material 408. In some embodiments, trenches (e.g., fin pillars 334 and/or features similar to fin pillars 334, such as the first portion 316 of the fin pillars 334) are used to channel the bonding material 408 toward edges of the second semiconductor 404. In FIG. 8A, the second semiconductor 404 rests directly on tops of pedestals 604.

In some embodiments, layer material 804, for example as depicted in FIGS. 8B and 8C, is positioned between the top surfaces of the pedestals 604 and the second semiconductor 404. For example, the layer material 804 is deposited on the first semiconductor 600 or the second semiconductor 404 before bonding. The layer material 804 is a rigid material, or a material with some amount of compliance. In some embodiments, the layer material 804 is used to reduce the risk of fracturing the first semiconductor 100 and/or the second semiconductor 404 while bonding. In FIG. 8B, layer material 804 is applied to the first semiconductor 600 before bonding. In FIG. 8C, the layer material 804 is applied to the second semiconductor 404 before bonding. In FIG. 8C, the layer material 804 is applied to the second semiconductor 404 and the bonding material 408 is applied to the layer material 804.

Figure 8D:
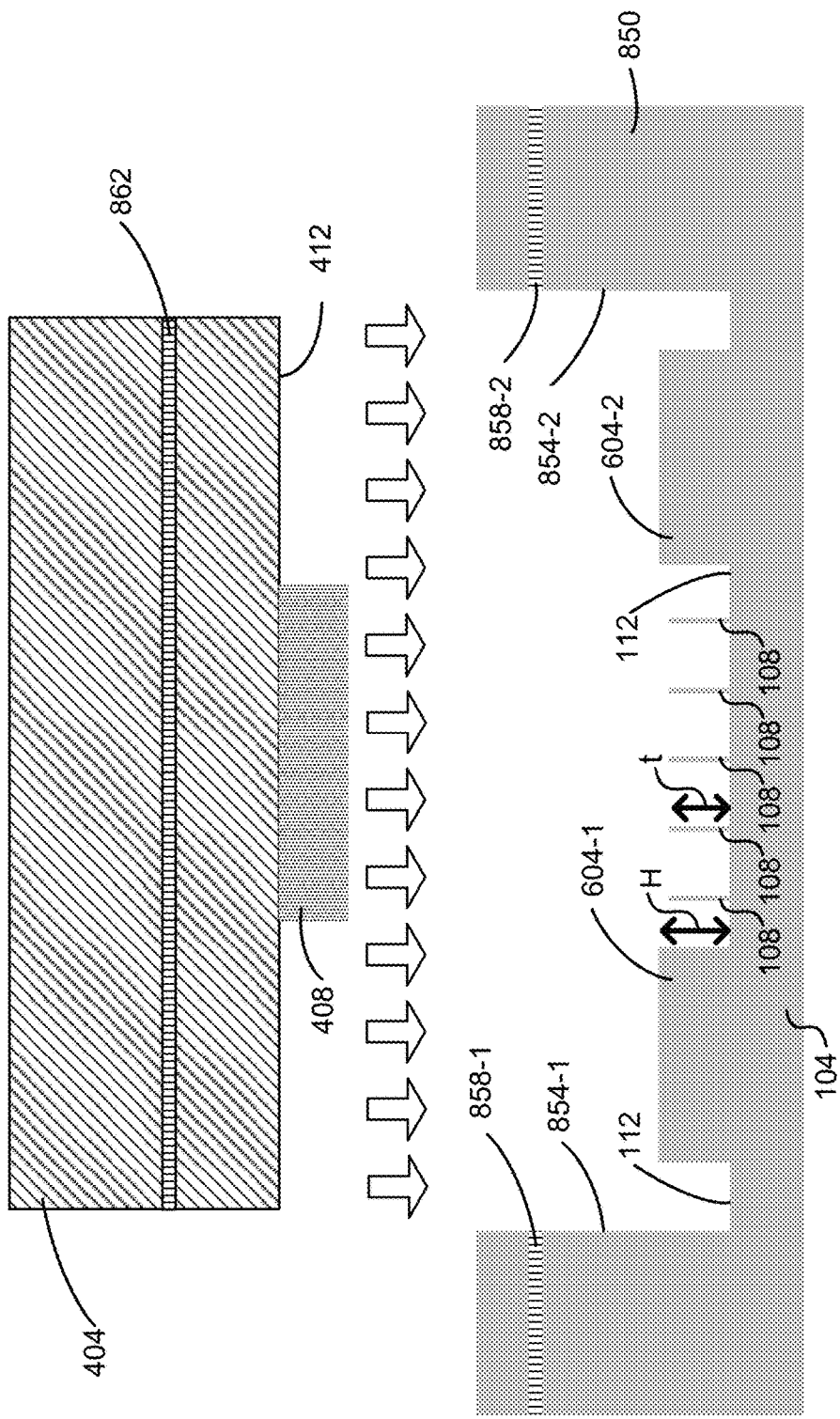
FIG. 8D depicts a side view of an embodiment of a first semiconductor having a pit with pillars and pedestals in the pit.

In FIG. 8D, a side view of an embodiment of a first semiconductor 850 having a pit is shown. The pit is formed by etching the first semiconductor 850. The pit is defined by walls 854 and the top surface 112 of the substrate 104. A first pedestal 604-1 and a second pedestal 604-2 are formed in the pit. Pillars 108 are formed in the pit between the first pedestal 604-1 and the second pedestal 604-2. A first waveguide 858-1 extends to a first wall 854-1 of the pit. A second waveguide 858-2 extends to a second wall 854-2 of the pit. The second semiconductor 404 comprises a feature 862 (e.g., a quantum well region and/or a waveguide). The pedestals 604 help position the second semiconductor 404 (e.g., height registration similar to alignment discussed in the '529 application, FIG. 1B) in relation to the first semiconductor 850 such that the feature 862 of the second semiconductor 404 is aligned to the first waveguide 858-1 and/or the second waveguide 858-2. In some embodiments, the feature 862 of the second semiconductor 404 is aligned to other features of the first semiconductor 850 instead of waveguides 858. In some embodiments, an insulating layer (e.g., SiO2) is between the waveguides 858 and the substrate 104 (e.g., the substrate 104, pedestals 604, and/or pillars 108 being formed in a handle portion of an SOI wafer and the waveguides 858 being formed in a device layer of the SOI wafer).

In some embodiments, bonding is enhanced by using pillars 108 in the pit. For example, heat transfer from the bonding material 408 (e.g., indium), which is attached to the second semiconductor 404, to the first semiconductor 850 (e.g., made of silicon) is initially reduced because a contact area between the bonding material 408 and the first semiconductor 850 (or the first semiconductor 100, or the first semiconductor 600) is reduced until the bonding material 408 is heated to a threshold temperature that the bonding material 408 begins to melt. The fill ratio area can be varied from 5% to 95% with the control of the density and shape of the pillars 108. In some embodiments, fill ratio is measured using an area for bonding material (e.g., an area between pedestals 624 filled with pillars 108). Reducing the contact area between the bonding material 408 and the first semiconductor 850 helps melt the bonding material 408 because less heat is transferred from the bonding material 408 to the first semiconductor 850. In a further example, once the bonding material 408 melts and the oxide surface is broken and/or penetrated by the pillars 108, space between the pillars 108 is filled with bonding material 408 to the bottom of the pit. Heights and/or shapes of the pillars 108 increases the bond area going from 2D bonding (e.g., bonding to a flat surface of a substrate) to 3D bonding; sides 124 of the pillars 108 provide an increased bond surface area.

Figure 9:
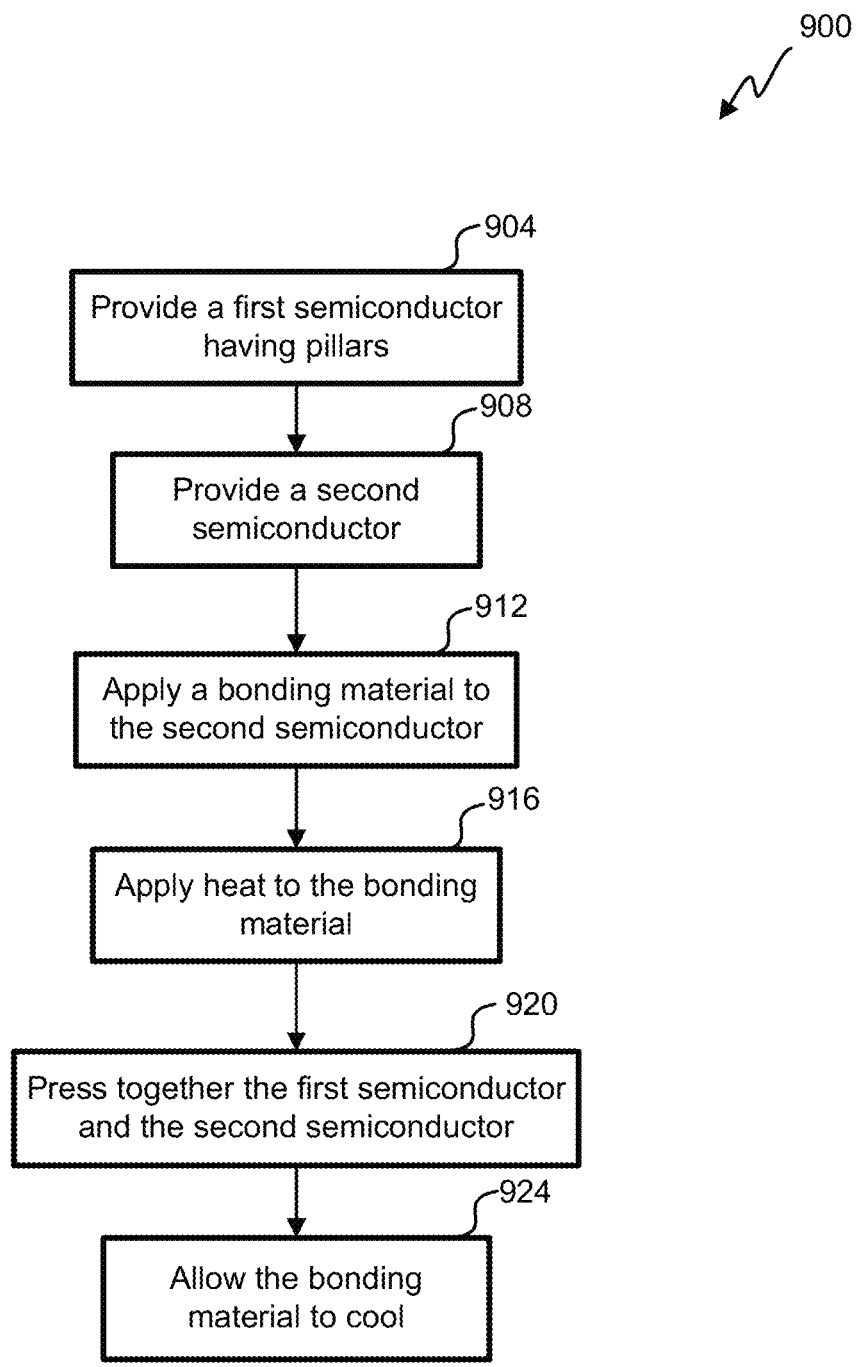
FIG. 9 depicts a flowchart of an embodiment of a process for bonding a first semiconductor to a second semiconductor.

Referring next to FIG. 9, a flowchart of an embodiment of a bonding process 900 for bonding a first semiconductor to a second semiconductor is shown. The bonding process 900 begins in step 904 where a first semiconductor (e.g., the first semiconductor 100, the first semiconductor 600, or the first semiconductor 850). comprising pillars is provided. In some embodiments, a silicon wafer is provided and etched to form pillars. In some embodiments, the first semiconductor further comprises pedestals used as hard stops for aligning the first semiconductor with the second semiconductor. In some embodiments, the first semiconductor comprises a pit (or recess) and the pillars (e.g., pillars 108) and/or pedestals (e.g., pedestals 604) are in the pit.

In step 908, a second semiconductor is provided (e.g., second semiconductor 404). A bonding material (e.g., bonding material 408, such as indium) is applied to the second semiconductor, step 912. In some embodiments, the bonding material is applied so that the bonding material does not contact top surfaces of the pedestals but does contact distal ends of the pillars. In step 916, heat is applied, using a heating source, to the second semiconductor so that a temperature of the bonding material is increased.

In step 920, the first semiconductor and the second semiconductor are pressed together so that the pillars puncture the bonding material. In some embodiments, the pillars are engulfed within the bonding material as the first semiconductor and the second semiconductor are pressed together, so that surfaces of pillars are surrounded by the bonding material. In some embodiments, the pillars are coated with a second material (e.g., a conducting material used for under-bump metallization) before the first semiconductor and the second semiconductor are pressed together. In some embodiments, the heating source is removed from being applied to the second semiconductor before the first semiconductor and the second semiconductor are pressed together.

In step 924, the bonding material is allowed to cool. In some embodiments, the bonding material contacts more surface area of the first semiconductor as compared to before the pillars punctuate the bonding material, thus increasing heat transfer from the bonding material to the first semiconductor, and the bonding material cools faster.

The specific details of particular embodiments may be combined in any suitable manner without departing from the spirit and scope of embodiments of the invention. However, other embodiments of the invention may be directed to specific embodiments relating to each individual aspect, or specific combinations of these individual aspects.

The above description of exemplary embodiments of the invention has been presented for the purposes of illustration and description. It is not intended to be exhaustive or to limit the invention to the precise form described, and many modifications and variations are possible in light of the teaching above. For example, similar methods could be used to bond electronic devices and/or metal to the first semiconductor. The embodiments were chosen and described in order to explain the principles of the invention and its practical applications to thereby enable others skilled in the art to utilize the invention in various embodiments and with various modifications as are suited to the particular use contemplated.

Further, in some embodiments, the second semiconductor comprises an active region for a detector or a modulator. For example, a mach-zehnder interferometer structure could be made in the first semiconductor (e.g., of silicon) and one or more second semiconductors (e.g., made of III-V material) could be used to modulate a phase change in the interferometer. In some embodiments, the first semiconductor comprises at least one of a CMOS device, a BiCMOS device, an NMOS device, a PMOS device, a detector, a CCD, diode, heating element, or a passive optical device (e.g., a waveguide, an optical grating, an optical splitter, an optical combiner, a wavelength multiplexer, a wavelength demultiplexer, an optical polarization rotator, an optical tap, a coupler for coupling a smaller waveguide to a larger waveguide, a coupler for coupling a rectangular silicon waveguide to an optical fiber waveguide, and a multimode interferometer).

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figure. A process may correspond to a method, a function, a procedure, a subroutine, a subprogram, etc.

A recitation of "a", "an", or "the" is intended to mean "one or more" unless specifically indicated to the contrary.

All patents, patent applications, publications, and descriptions mentioned here are incorporated by reference in their entirety for all purposes. None is admitted to be prior art.

What is claimed is:

1. A bonded semiconductor device, the bonded semiconductor device comprising:
   a first semiconductor, the first semiconductor comprising:
      a substrate; and
      a plurality of pillars, wherein:
         the plurality of pillars extend from the substrate; and
         each pillar of the plurality of pillars comprises:
            a proximal end;
            a distal end, opposite the proximal end, wherein the proximal end is closer to the substrate than the distal end;
            a width equal to or less than 25 microns; and
            one or more sides between the proximal end and the distal end;
   a second semiconductor, wherein the second semiconductor comprises material not in the first semiconductor; and
   a material, wherein:
      the material fastens the first semiconductor to the second semiconductor;
      the material is a conductor and configured to be an electrical contact between the first semiconductor and the second semiconductor; and
      the material surrounds each of the plurality of pillars by contacting the one or more sides of each pillar of the plurality of pillars.

2. The bonded semiconductor device of claim 1, wherein the plurality of pillars each have a rectangular cross section.

3. The bonded semiconductor device of claim 1, wherein:
   the first semiconductor is made of silicon; and
   the plurality of pillars are etched from a same wafer as the substrate.

4. The bonded semiconductor device of claim 3, wherein the second semiconductor is a composite semiconductor comprising III-V material.

5. The bonded semiconductor device of claim 1, wherein the substrate further comprises a pedestal, wherein:
   a surface of the pedestal is at a first height above a surface of the substrate;
   the plurality of pillars extend to a second height above the surface of the substrate; and
   the first height is greater than the second height.

6. The bonded semiconductor device of claim 5, wherein the surface of the pedestal is in contact with the second semiconductor without bonding material being between the surface of the pedestal and the second semiconductor.

7. The bonded semiconductor device of claim 1, wherein:
   a pillar of the plurality of pillars has a first cross section and a second cross section;
   the first cross section is parallel to the second cross section;
   the first cross section is parallel with the substrate;
   the first cross section is closer to the substrate than the second cross section; and
   the first cross section has an area larger than the second cross section.

8. A bonded semiconductor device, the bonded semiconductor device comprising:
   a first semiconductor, the first semiconductor comprising:
      a substrate; and
      a plurality of pillars, wherein:
         the plurality of pillars extend from the substrate; and
         each pillar of the plurality of pillars comprises:
            a proximal end;
            a distal end, opposite the proximal end, wherein the proximal end is closer to the substrate than the distal end;
            a width equal to or less than 25 microns; and
            one or more sides between the proximal end and the distal end;
         a pillar of the plurality of pillars has a first cross section and a second cross section;
         the first cross section is parallel to the second cross section;
         the first cross section is closer to the substrate than the second cross section; and
         the first cross section has an area less than the second cross section; and
      the area of the second cross section is greater than twice the area of the first cross section;
   a second semiconductor, wherein the second semiconductor comprises material not in the first semiconductor; and
   a material, wherein:
      the material fastens the first semiconductor to the second semiconductor; and
      the material surrounds each of the plurality of pillars by contacting the one or more sides of each pillar of the plurality of pillars.

9. The bonded semiconductor device of claim 1, wherein the material comprises indium.

10. The bonded semiconductor device of claim 1, wherein each pillar of the plurality of pillars comprises silicon and one or more layers of a dielectric and/or metal coating the silicon, such that the one or more layers are between silicon and the material.

11. The bonded semiconductor device of claim 1, wherein the material has a melting temperature, and the material secures the second semiconductor to the first semiconductor after the material cools below the melting temperature.

12. A semiconductor structure, the semiconductor structure comprising:
a substrate;
a plurality of pillars, wherein:
the plurality of pillars extend from the substrate to a first height; and
each pillar of the plurality of pillars comprises:
a proximal end; and
a distal end, opposite the proximal end, wherein the proximal end is closer to the substrate than the distal end;
a pillar of the plurality of pillars is defined by a first width; and
the first width is equal to or less than 25 microns and the plurality of pillars are configured to puncture an oxide formed on a material, wherein the material is for bonding the semiconductor structure to another semiconductor structure; and
a plurality of pedestals extending from the substrate to a second height, wherein:
the first height is less than the second height;
a pedestal of the plurality of pedestals is defined by a second width; and
the second width is greater than the first width.

13. The semiconductor structure of claim 12, wherein the second width is equal to or less than 25 μm.

14. The semiconductor structure of claim 12, wherein the distal end of at least one of the plurality of pillars is pointed by at least:
the at least one of the plurality of pillars having a first cross section and a second cross section;
the first cross section is parallel to the second cross section;
the first cross section is closer to the substrate than the second cross section;
the first cross section is parallel with the substrate; and
the first cross section has an area larger than the second cross section.

15. The semiconductor structure of claim 12, further comprising:
a second semiconductor, wherein the substrate, the plurality of pillars, and the plurality of pedestals are part of a first semiconductor; and
the material, wherein the material secures the first semiconductor to the second semiconductor, such that:
the material surrounds each of the plurality of pillars, contacting sides of pillars of the plurality of pillars; and
the second semiconductor contacts surfaces of pedestals of the plurality of pedestals.

16. The semiconductor structure of claim 15, wherein the material has a melting temperature, and the material secures the second semiconductor to the first semiconductor after the material cools below the melting temperature.

17. The semiconductor structure of claim 12, further comprising the material, wherein the material is configured to form a part of an ohmic contact to the substrate.

18. The semiconductor structure of claim 17, wherein the material comprises indium.

19. The semiconductor structure of claim 12, wherein the plurality of pillars are coated with a conducting material used for under-bump metallization.

20. The bonded semiconductor device of claim 5, further comprising a layer between the pedestal and the second semiconductor, where in the layer prevents direct contact between the pedestal and the second semiconductor.

* * * * *